United States Patent [19]
Fandrich et al.

[11] Patent Number: 5,519,847
[45] Date of Patent: May 21, 1996

[54] METHOD OF PIPELINING SEQUENTIAL WRITES IN A FLASH MEMORY

[75] Inventors: Mickey L. Fandrich, Placerville; Richard J. Durante, Citrus Heights; Rodney R. Rozman, Placerville, all of Calif.

[73] Assignee: Intel Corporation, Santa Clara, Calif.

[21] Appl. No.: 85,969

[22] Filed: Jun. 30, 1993

[51] Int. Cl.$^6$ .......................... G06F 12/00; G11C 17/00; G11C 8/00

[52] U.S. Cl. .................... 395/496; 395/428; 364/DIG. 1; 364/DIG. 2; 365/185.33

[58] Field of Search ............................... 364/200 MS File, 364/900 MS File; 365/230.08, 230.09, 900; 395/425, 428–430, 467, 496, 550

[56] References Cited

U.S. PATENT DOCUMENTS

| | | | |
|---|---|---|---|
| 4,649,541 | 3/1987 | Lahmeyer | 371/37.1 |
| 4,694,398 | 9/1987 | Crotean | 364/413.24 |
| 4,774,581 | 9/1988 | Shiratsuchi | 348/561 |
| 5,001,626 | 3/1991 | Kashiyama et al. | 395/800 |
| 5,081,700 | 1/1992 | Crozier | 395/150 |
| 5,101,341 | 3/1992 | Circello et al. | 395/375 |
| 5,359,569 | 10/1994 | Fujita et al. | 365/229 |
| 5,398,325 | 3/1995 | Chang et al. | 395/425 |
| 5,404,482 | 4/1995 | Stamm et al. | 395/425 |

OTHER PUBLICATIONS

John L. Hennessy and David A. Patterson, *Computer Architecture a Quantitative Approach*, pp. 251–257 (Morgan Kaufman Publishers, Inc. 1990).

Primary Examiner—Matthew M. Kim
Attorney, Agent, or Firm—Blakely, Sokoloff, Taylor & Zafman

[57] ABSTRACT

A method of increasing the data throughput of a memory device including a page buffer. Data throughput is increased by pipelining write operations such that one plane of the page buffer is being used to program the memory array of the device while the other plane of the page buffer is being loaded with data to be used in the next program operation. The first write operation is set up by loading a first block of data in to the first plane of the page buffer. In the following clock cycle, the first operation begins by commanding the memory device to program the memory array with the first block of data stored in the first plane. The second write operation is setup immediately following the first command to program. The second write operation is setup by loading a second block of data into the second plane of the page buffer. Loading of the second plane occurs while the memory array is being programmed from the first plane. The second write operation begins by commanding the array controller to program the flash memory array with the second block of data stored in the second plane.

24 Claims, 14 Drawing Sheets

| MODE NO. | MODE [2:0] | DESCRIPTION |
|---|---|---|
| 2 | 010 | IC 40 READS FROM A PLANE |
| 3 | 011 | IC 40 WRITES TO A PLANE |
| 4 | 100 | FAC 50 READS FROM A PLANE |
| 5 | 101 | FAC 50 WRITES TO A PLANE |

PLANE SELECT   ROW ADDRESS   HIGH/LOW BYTE

| STATE OF SIGNAL | | | |
|---|---|---|---|
| FAC OVERRIDE | FAC PLANE STATUS | FAC PLANE SELECT | FAC PLANE ASSIGNMENT |
| 00 | 1 | 0 | PLANE A |
| 00 | 1 | 1 | PLANE B |
| 01 | x | x | PLANE A |
| 10 | x | x | PLANE B |
| 11 | x | x | REMNANT BITS IN PLANE A AND B |

| STATE OF SIGNALS | | |
|---|---|---|
| IC PLANE SELECT | IC PLANE STATUS | IC PLANE ASSIGNMENT |
| 0 | 1 | PLANE A |
| 1 | 1 | PLANE B |

| INPUT SIGNALS | | | | | | OUTPUT SIGNALS |
|---|---|---|---|---|---|---|
| PLANE B MODE [2:0] 335 | FAC OVERRIDE [1:0] | FAC ADDR [0] | FAC BYTE 352 | IC BYTE 334 | | PLANE B SELECT [2:0] 339 |
| 01x | xx | x | x | 1 | | 001 |
| 01x | xx | x | x | 1 | | 010 |
| 01x | xx | x | x | 0 | | 011 |
| 011 | xx | x | x | x | | 111 |
| 10x | 00,01,10 | 0 | x | x | | 001 |
| 10x | 00,01,10 | 1 | x | x | | 010 |
| 10x | 00,01,10 | x | 0 | x | | 011 |
| 10x | 11 | x | x | x | | 100 |

FIG. 13

| INPUT SIGNALS | | | | | | OUTPUT SIGNALS |
|---|---|---|---|---|---|---|
| PLANE A MODE [2:0] 333 | FAC OVERRIDE [1:0] | FAC ADDR [0] | IC ADDR [0] | FAC BYTE 352 | IC BYTE 344 | PLANE A SELECT [2:0] 337 |
| 01x | xx | x | 0 | x | 1 | 001 |
| 01x | xx | x | 1 | x | 1 | 010 |
| 01x | xx | x | x | x | 0 | 011 |
| 10x | 00,01,10 | 0 | x | x | x | 001 |
| 10x | 00,01,10 | 1 | x | x | x | 010 |
| 10x | 00,01,10 | x | x | 0 | x | 011 |
| 10x | 11 | x | x | x | x | 100 |

FIG. 14

| INPUT SIGNALS | | | | OUTPUT SIGNALS 47 | |
|---|---|---|---|---|---|
| PLANE A MODE [2:0] 333 | PLANE A SELECT [2:0] 337 | PLANE B MODE [2:0] 335 | PLANE B SELECT [2:0] 339 | IC DATA[15:8] | IC DATA[7:0] |
| x10 | 001 | xxx | xxx | PLANE A DATA[7:0] | PLANE A DATA[7:0] |
| x10 | 010 | xxx | xxx | PLANE A DATA[15:8] | PLANE A DATA[15:8] |
| x10 | 011 | xxx | xxx | PLANE A DATA[15:8] | PLANE A DATA[7:0] |
| x10 | 100 | xxx | xxx | 0:5 AND PLANE A DATA [18:16] | 0:5 AND PLANE A DATA [18:16] |
| xxx | xxx | x10 | 001 | PLANE B DATA[7:0] | PLANE B DATA[7:0] |
| xxx | xxx | x10 | 010 | PLANE B DATA[15:8] | PLANE B DATA[15:8] |
| xxx | xxx | x10 | 011 | PLANE B DATA[15:8] | PLANE B DATA[7:0] |
| xxx | xxx | x10 | 100 | 0:5 AND PLANE B DATA [18:16] | PLANE B DATA[18:16] |
| ALL OTHERS | xxx | ALL OTHERS | xxx | NOT DRIVEN | NOT DRIVEN |

FIG. 16

| INPUT SIGNALS | | | | OUTPUT SIGNALS | | 232 |
|---|---|---|---|---|---|---|
| PLANE A MODE [2:0] 333 | PLANE A SELECT [2:0] 337 | PLANE B MODE [2:0] 335 | PLANE B SELECT [2:0] 339 | FAC DATA[15:8] | FAC DATA[7:0] | |
| 100 | 001 | xxx | xxx | PLANE A DATA[7:0] | PLANE A DATA[7:0] | |
| 100 | 010 | xxx | xxx | PLANE A DATA[15:8] | PLANE A DATA[15:8] | |
| 100 | 011 | xxx | xxx | PLANE A DATA[15:8] | PLANE A DATA[7:0] | |
| 100 | 100 | xxx | xxx | 0:5 AND PLANE A DATA [18:16] | 0:5 AND PLANE A DATA [18:16] | |
| xxx | xxx | 100 | 001 | PLANE B DATA[7:0] | PLANE B DATA[7:0] | |
| xxx | xxx | 100 | 010 | PLANE B DATA[15:8] | PLANE B DATA[15:8] | |
| xxx | xxx | 100 | 100 | 0:5 AND PLANE B DATA [18:16] | PLANE B DATA[18:16] | |
| xxx | xxx | 100 | 011 | PLANE B DATA[15:8] | PLANE B DATA[7:0] | |
| ALL OTHERS | xxx | ALL OTHERS | xxx | NOT DRIVEN | NOT DRIVEN | |

FIG. 17

METHOD OF PIPELINING SEQUENTIAL WRITES IN A FLASH MEMORY

FIELD OF THE INVENTION

The present invention pertains to flash memory devices. More particularly, this invention relates to a method of increasing the data throughput of a flash memory device including a page buffer having two planes.

BACKGROUND

Typical flash memory devices contain a nonvolatile memory cell array for random access data storage. Some prior flash memory devices also include a write control circuit for programming and erasing the memory cell array.

Prior flash memory devices may employ an on-chip data buffer to increase programming throughput of the flash cell array. The data buffer enables increased programming speed by buffering programming data. The data buffer enables fast access to the programming data by the write control circuit. The fast access to the programming data enables the write control circuit to amortize the cycling of program level voltages across multiple bytes in the flash cell array.

In such prior flash memory devices, a user typically provides an input/output driver that loads programming data into the data buffer. The input/output driver then issues a program command to the write control circuit. Thereafter, the write control circuit accesses the data within the data buffer and uses that data to program the flash cell array. The input/output driver can load another block of data into the data buffer only after the write control circuit completes programming, and is no longer accessing the data buffer.

In such prior flash memory devices, because the data buffer is not accessible by the input/output driver while the write control circuit is accessing the data buffer, the input/output driver idles while waiting for the write control circuit to complete the program operation. The idle time of the input/output driver reduces programming throughput and data throughput of the flash memory device.

SUMMARY

An object of the present invention is to improve the data throughput of a flash memory device by using a page buffer within the flash memory device.

A method of increasing the data throughput of a memory device including a page buffer is described. Data throughput is increased by pipelining write operations such that one plane of the page buffer is being used to program the memory array of the memory device while the other plane of the page buffer is being loaded by an external user with data to be used in the next program operation. The first write operation is set up by loading a first block of data into the first plane of the page buffer. The first operation begins with the external user commanding the memory device to program the memory array with the first block of data stored in the first plane. The second write operation is setup by the external user immediately following the first command to program. The second write operation is setup by loading a second block of data into the second plane of the page buffer while the memory array is being programmed from the first plane. The second write operation begins with the external user commanding the array controller to program the flash memory array with the second block of data stored in the second plane.

Other objects, features and advantages of the present invention will be apparent from the accompanying drawings, and from the detailed description that follows below.

BRIEF DESCRIPTION OF THE DRAWINGS

The present invention is illustrated by way of example and not limitation in the figures of the accompanying drawings in which like references indicate similar elements, and in which:

FIG. 13 is a truth table of the states of plane B select signals.

FIG. 14 is a truth table of the states of the plane A select signals.

FIG. 16 is a truth table for the output data aligner circuit.

FIG. 17 is another truth table for the output data aligner circuit.

DETAILED DESCRIPTION

Figure 1:
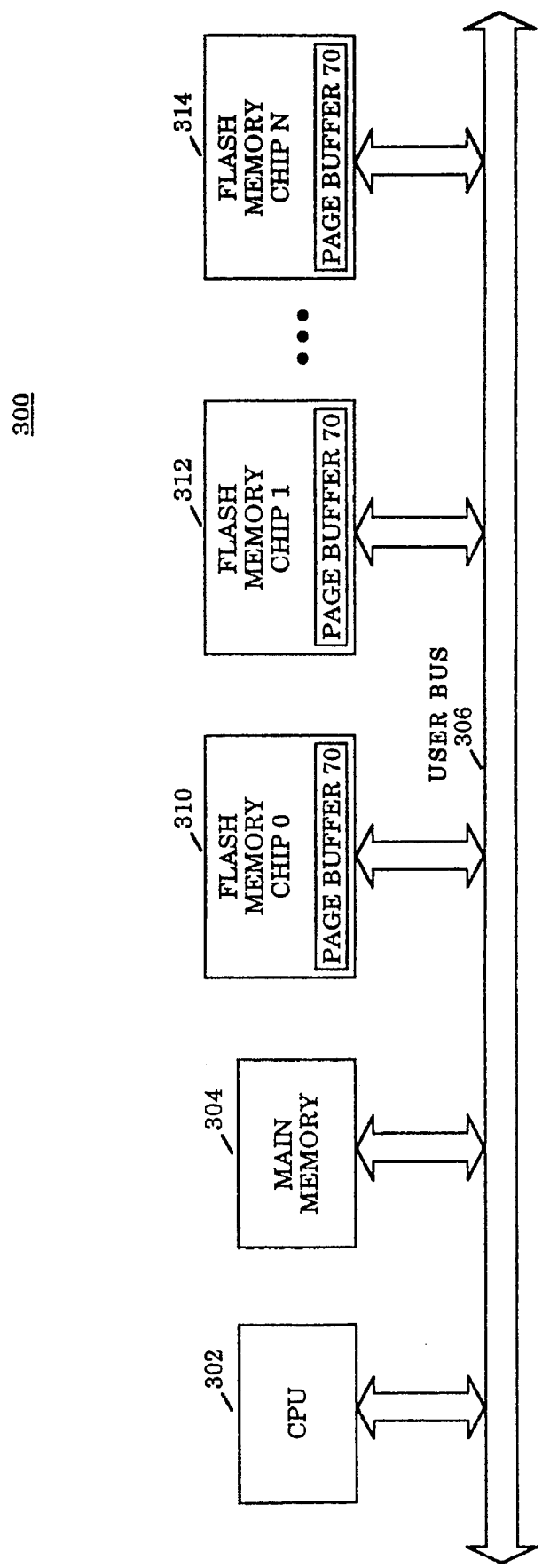
FIG. 1 is a block diagram of a computer system.

FIG. 1 is a block diagram of computer system 300. Computer system 300 includes central processing unit (CPU) 302, main memory 304, and flash memory devices 310–314. CPU 302 communicates with main memory 304 and flash memory devices 310–314 over user bus 306. Within computer system 300, flash memory devices 310–314 provide random access, nonvolatile, large scale data storage.

As will be described in more detail below, CPU 302 is able to eliminate dead time associated with performing sequential writes to random access memory and increase the data throughput of flash memory devices 310–314 using the method of the present invention. The method of performing sequential writes takes advantage of page buffer 70 within each flash memory chip 310, 312, and 314. For example, CPU 302 is able to write, or load, data associated with one write command into page buffer 70 while write data associated with a previous write command is being written from page buffer 70 into the flash memory cell array of a flash memory device.

Figure 2:
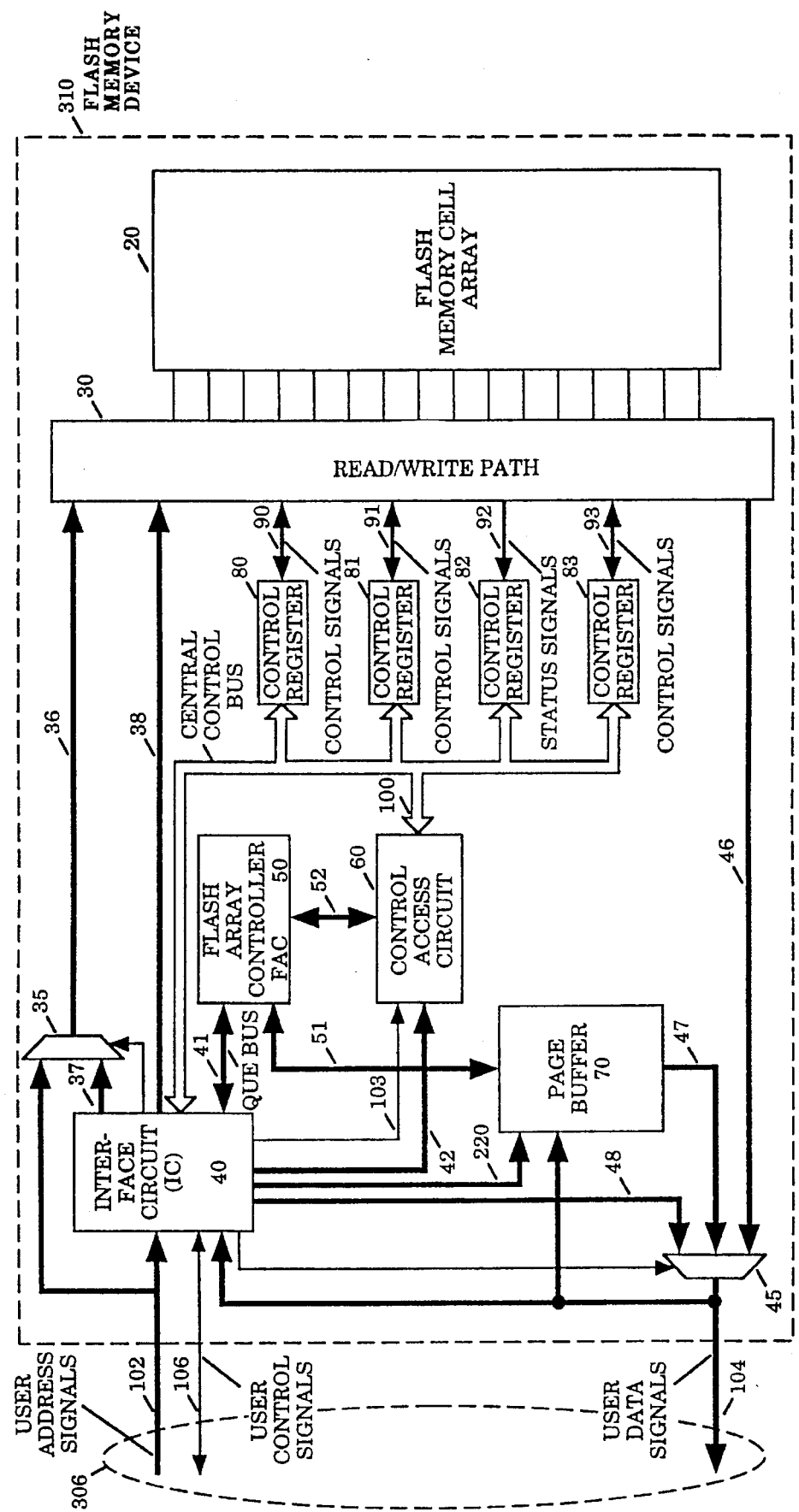
FIG. 2 is a block diagram of a flash memory device.

Prior to beginning a detailed discussion of the method of performing sequential writes, knowledge of the internal organization of flash memory devices 310, 312 and 314 is helpful. FIG. 2 is a block diagram of the internal organization of flash memory device 310. Flash memory devices 312 and 314 are organized in the same fashion, and it will be understood that the discussion of flash memory device 310 applies equally to flash memory device 312 and 314. Flash memory device 310 includes flash memory cell array 20, interface circuit 40, flash array controller 50, page buffer 70, a set of control registers 80– 83, and read/write path 30. External users, such as CPU 302, communicate with flash memory device 310 via user bus 306. User bus 306 includes user address bus 102, user data bus 104, and user control bus 106. These buses 102, 104 and 106 are appropriately coupled to pads, or pins, of flash memory device 310.

Page buffer 70 is an array of static random access memory cells (SRAM), which serves multiple purposes within flash memory device 310. Page buffer 70 can be accessed both by CPU 302 and flash array controller 50. As will be described in more detail below, the organization of page buffer 70 permits CPU 302 to write to page buffer 70 while flash array controller 50 is also using page buffer 70 to program flash memory cell array 20.

Flash memory cell array 20 is an array of flash memory cells, which store data. In one embodiment, flash memory cell array 20 is organized as 32 blocks. Each block provides 64k bytes of data storage. In one embodiment, each block is 16 bits wide, but may be accessed by CPU 302 either by 8 bits or by 16 bits.

Read/write path 30 includes read and write path circuitry for accessing flash memory cell array 20. Read/write path 30 includes row and column address decoding circuitry for decoding address signals and generating appropriate block select row and column signals for flash memory cell array 20. Read/write path 30 also includes a small array of reference flash cells, and sense path circuitry for comparing the reference flash cells to cells from flash memory cells array 20 to determine whether memory bits or cells store a logic 1 or logic 0.

Control registers 80–83 contain specialized control registers and associated circuitry for controlling read/write path 30. The specialized control registers are programmed and accessed over central control bus 100. Control access circuit 60 enables both interface circuit 40 and flash array controller 50 to access control registers 80–83 over central control bus 100.

Interface circuit 40 enables access to flash memory cell array 20 by receiving and processing commands received over user bus 306. Interface circuit 40 receives commands over user data bus 104, verifies the commands, and queues the commands to flash array controller 50 over queue bus 41. Thereafter, flash array controller 50 executes the command.

Interface circuit 40 controls the selection of an input address 36 coupled to read/write path 30 via input address multiplexer 35. The selected input address 36 is either the address sensed by TTL buffers (not shown) on user address bus 102, or a latched address 37 from interface circuit 40. The input address 36 may be overridden by programming control registers of control register 84.

Interface circuit 40 selects the source of output data to be coupled to user data bus 104. Interface circuit 40 does so by controlling controls output data multiplexer 45. The selected output data is either flash array data 46 from read/write path 30, page buffer data 47 from page buffer 70, or block status register (BSR) data 48 from a set of block status registers contained within interface circuit 40.

Flash array controller 50 is a specialized processor for performing write operations on flash memory cell array 20.

Flash array controller 50 uses the commands received over queue bus 41 to locate the appropriate instruction within a control store.

CPU 302 reads flash memory cell array 20 by transferring address signals over user address bus 102 while signaling a read command over user control bus 106. Interface circuit 40 detects the read cycles and causes the input address multiplexer 35 to transfer the address signals on user address bus 102 through to the x and y decode circuitry of read/write path 30. Interface circuit 40 also causes the output data multiplexer 45 to transfer the addressed read data from the read/write path 30 over user data bus 104.

CPU 302 writes data to flash memory cell array 20 by signaling a write command and using user bus 306 to transfer blocks of data to be programmed into page buffer 70. Interface circuit 40 verifies the write command, and queues the write command to flash array controller 50. Flash array controller 50 executes the write command by reading the data to be programmed from page buffer over controller bus 51, and by programming the appropriate address locations within flash memory cell array 20.

Flash array controller 50 implements algorithms for sequencing the high voltage circuitry of read/write path 30 to program flash memory cell array 20 by applying charge to flash cells and to erase flash memory cell array 20 by removing charge from the flash cells. Flash array controller 50 controls the high voltage circuitry and addresses flash memory cell array 20 by accessing control registers 80–83 via central control bus 100.

Read/write path 30 includes source switch circuitry for applying the appropriate voltage levels to flash memory cell array 20 for an erase function. Read/write path 30 also includes program load circuitry for driving program level voltages onto bit lines of flash memory cell array 20 during programming operations.

Interface circuit 40 includes a global status register which indicates the status of page buffer 70. Flash array controller 50 maintains the status bits of the global status register. CPU 302 reads the contents of the global status registers via user bus 306.

Figure 3:
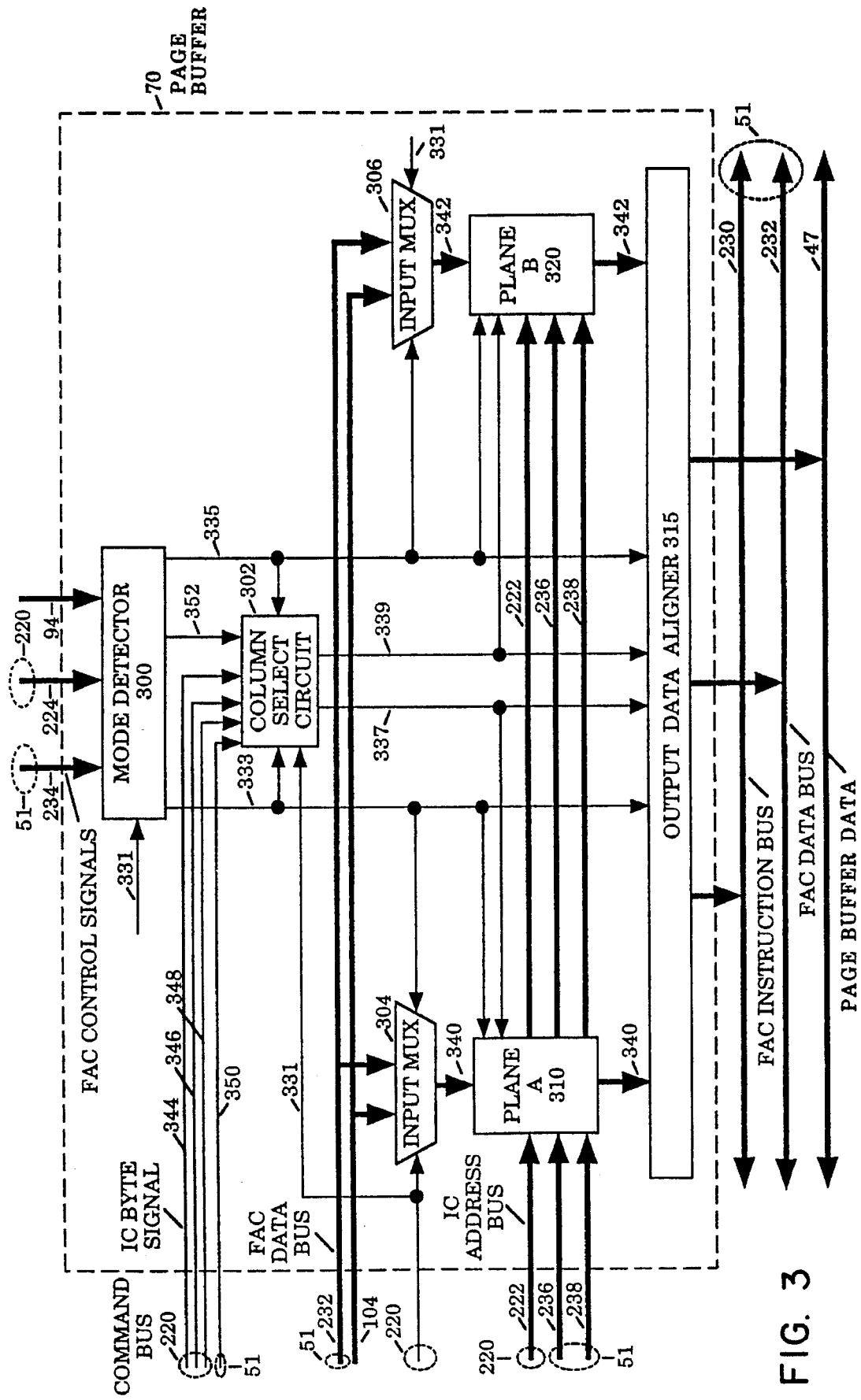
FIG. 3 is a block diagram of the page buffer.
Figures 4, 5:
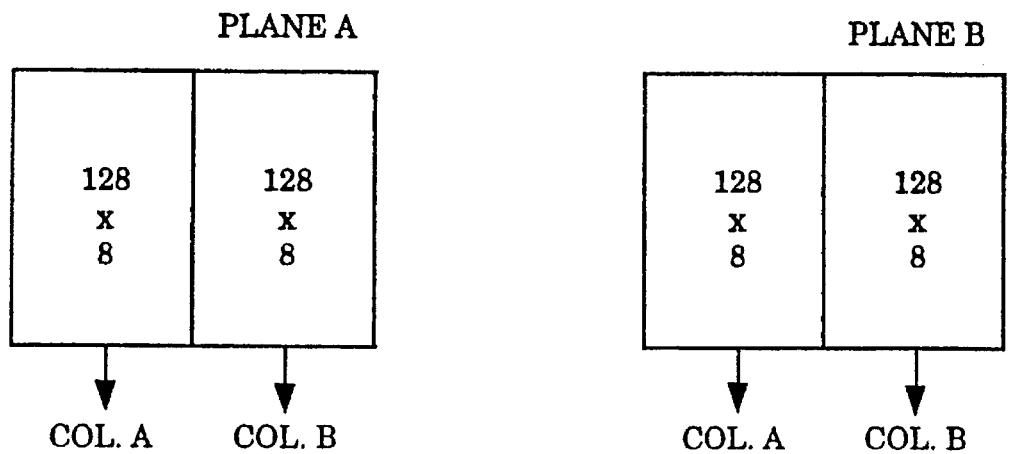
FIG. 4 illustrates the architecture of Plane A and Plane B of the plane buffer.
FIG. 5 describes the modes of the page buffer.

FIG. 3 is a block diagram illustrating page buffer 70. Page buffer 70 includes two 256 by 8 bit static random access memory (SRAM) planes, plane A and plane B. FIG. 4 illustrates the organization of Plane A 310 and Plane B 320 of page buffer 70. Plane A 310 and Plane B 320 each include two 128×8 bit columns, which are called column A and column B, respectively.

Command bus 220 includes interface circuit (IC) address bus 222, a set of IC control signals (not shown) and IC byte signal 344. Controller bus 51 includes flash array controller (FAC) data bus 232, FAC address bus 236, FAC program counter bus 238, FAC instruction bus 230, and FAC control signals 234.

The rows of Plane A 310 and Plane B 320 are addressed over IC address bus 222, FAC address bus 236, and FAC program counter bus 238. Command state machine 210 addresses Plane A 310 and Plane B 320 over IC address bus 222. Flash array controller 50 addresses Plane A 310 and Plane B 320 during data accesses via FAC address bus 236. Flash array controller 50 addresses Plane A 310 and Plane B 320 during instruction fetches over FAC program counter bus 238.

Page buffer 70 also includes mode detector circuit 300, column select circuit 302, a pair of input multiplexers 304 and 306, and output data circuit aligner 315.

FIG. 5 describes an embodiment of the modes of page buffer 70. Page buffer 70 can operate in four user modes, which will be called mode 2 through 5. These modes apply to both plane A and plane B, and are selected via mode signals Mode[2:0] for each plane.

In mode 2, interface circuit 40 allows an external user to read a plane of page buffer 70.

In mode 3, interface circuit 40 allows the external user to write to a plane of page buffer 70. A user mode write to a plane of page buffer 70 may be either a write byte/word transaction or a write sequential transaction. A write byte/word transaction to page buffer 70 begins when interface circuit 40 receives a write page buffer command from CPU 302 over user bus 306. The write page buffer command specifies a write address within page buffer 70, as well as the data to be written at that address. Let us call this data "write data". Command state machine 210 transfers the write address to a plane of page buffer 70 over IC address bus 222. The plane receives the write data over user data bus 104.

A sequential write to a plane of page buffer 70 begins when interface circuit 40 receives a write page buffer sequential command from CPU 302 over user bus 306. The write page buffer sequential command specifies a byte count, which indicates the number of bytes that will be written. Interface circuit 40 includes a write counter circuit (not shown). The write counter circuit is loaded with the byte count upon receipt of the write page buffer sequential command. Thereafter, the write counter circuit counts down as the selected page buffer plane receives the write data via user data bus 104. While the write data is being received, command state machine 210 addresses the selected page buffer plane over IC address bus 222 according to write counter circuit.

In mode 4, the flash array controller 50 allows an external user to read from a page buffer plane. For example, flash array controller 50 reads programming data from a page buffer plane during a program with page buffer operation. Flash array controller 50 addresses the selected page buffer plane over FAC address bus 236. Flash array controller 50 receives the corresponding programming data from the selected page buffer plane over FAC data bus 232.

In mode 5, the flash array controller 50 allows an external user to write to a page buffer plane. Flash array controller 50 addresses the selected page buffer plane over FAC address bus 236, and transfers the corresponding write data to the selected page buffer plane over FAC data bus 232.

In these modes interface circuit 40 coordinates access to plane A and plane B according to commands received over user bus 306, and ensures that interface circuit 40 and flash array controller 50 do not access the same plane.

Page buffer 70 will be discussed in still greater detail below; however, its description at this point permits discussion of a method of pipelining sequential writes to flash memory device 310. When implemented by CPU 302, this method maximizes the data throughout of flash memory device 310, thereby decreasing dead time of CPU 302. CPU 302 need not wait for flash memory device 310 to complete one programming command prior to beginning another programming command for flash memory. Similarly, flash memory device 310 need not wait for CPU 302 to load program data prior to beginning another program operation. Thus, CPU cycles and flash device cycles that would have previously been inactive, or dead, become active.

Figure 6:
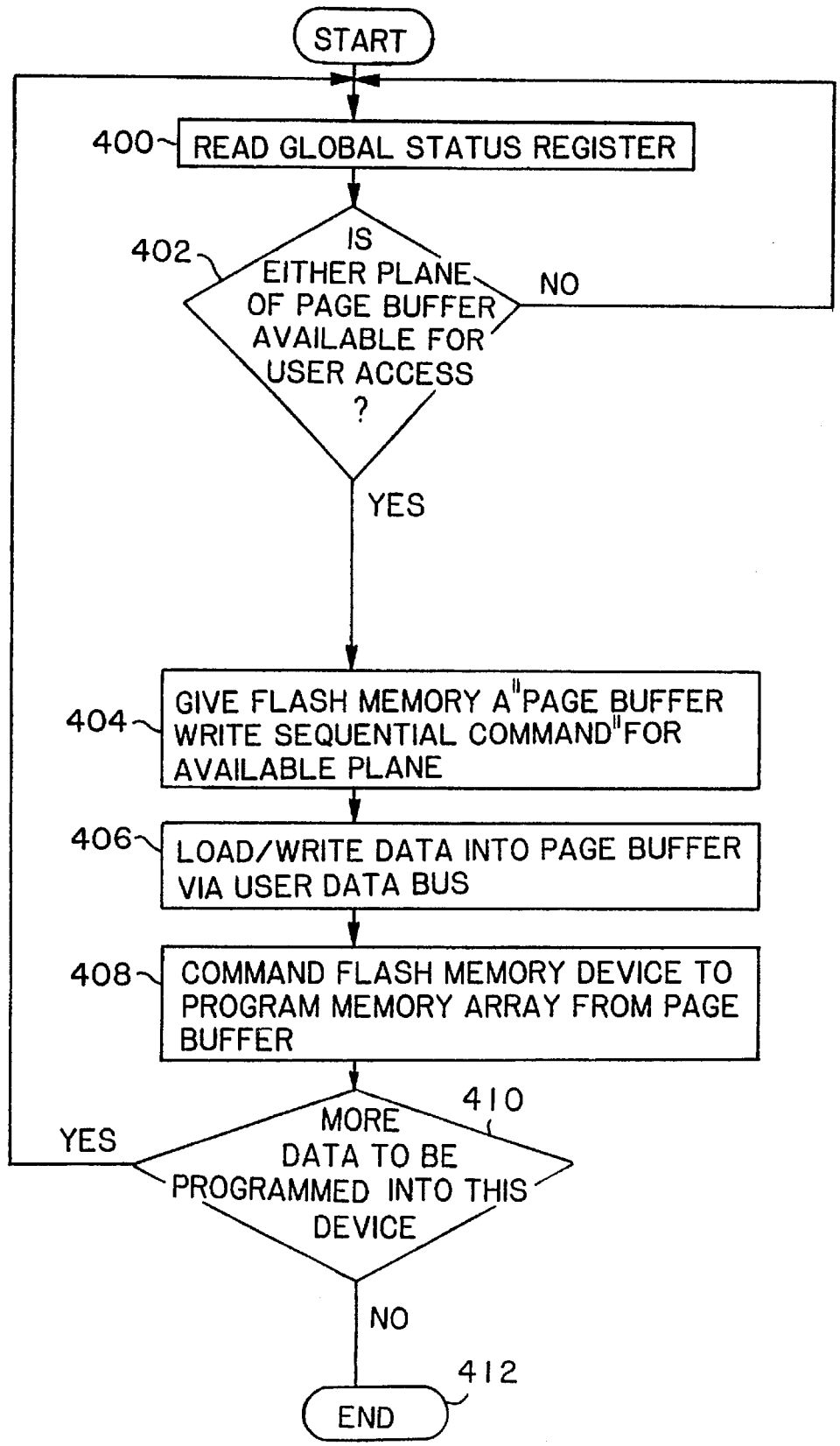
FIG. 6 illustrates a method of pipelining writes to a flash memory device.

FIG. 6 illustrates the method of pipelining writes to flash memory device 310. This method uses both planes of page buffer 70 to interleave write commands. To perform sequential writes to plane of page buffer 70 a plane must be available for user access. CPU 302 determines whether a plane is available by reading a bit stored within a global status register, which is part of block status register 216. Reading the global status register is a two step process for CPU 302. First, in step 400, CPU 302 issues a read status register command accompanied by the address of the global status register. In response to the read status register command, the global status register outputs a bit indicating the availability for user access of a page buffer plane, PBAVAIL, which is coupled to CPU 302 via user data bus 104. CPU 302 then evaluates PBAVAIL bit in step 402 to see if a plane of page buffer 70 is available for access. A plane is available whenever it is not allocated to flash array controller 50.

Assume that PBAVAIL indicates to CPU 302 that a plane is available for user access. CPU 302 may now begin pipelining writes to flash memory device 310 by proceeding to step 404.

CPU 302 initiates a write cycle for flash memory device 310 in step 404. As used herein, a write cycle includes two stages. First CPU 302 loads a plane of page buffer 70 in the second stage then flash array controller 50 programs flash memory cell array 20 with the data loaded into that plane.

Figure 7:
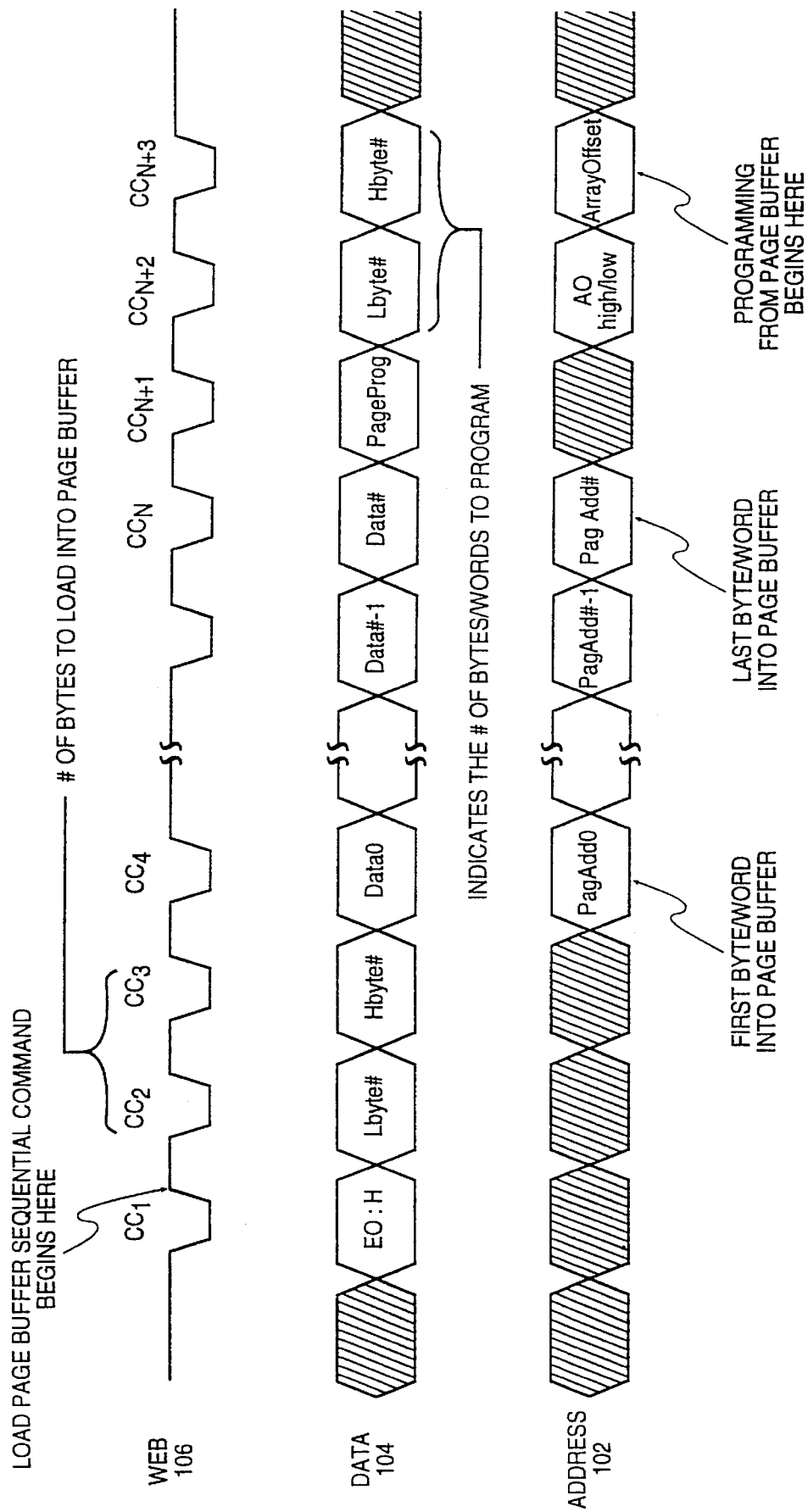
FIG. 7 illustrates the control, address and data signals for a write cycle using the method of FIG. 6.

FIG. 7 illustrates the combination of control signals, address signals and data signals that CPU 302 couples to user bus 306 in step 404 to issue a load page buffer sequential command to flash memory device 310. During the first CPU clock cycle of the load, CPU 302 brings the write enable signal, WEB, active low while applying signals to user data bus 104 representating in hexadecimal a load page buffer sequential command code. In one embodiment, the command code for a load page buffer sequential command is E0 (hexadecimal). The particular command code representing a load page buffer sequential is not important to this invention, only that CPU 302 give the correct command code for a sequential load of page buffer 70. In the following CPU clock cycle, CPU 302 informs flash memory device 310 of the number of bytes or words of data that will be loaded into the allocated plane of page buffer 70. Whether the number indicates bytes or words depends upon whether the flash memory device is operating in a by 8 or by 16 mode.

The number of CPU clock cycles required to indicate the number of bytes to be sequentially loaded into page buffer 70 depends on the number of data pins provided by flash memory chip 310 and the memory size of the planes. In the embodiment illustrated in FIG. 7, two CPU clock cycles, $CC_2$ and $CC_3$, are required to indicate the number of bytes to be loaded. The low byte, including the least significant bits of the number, is loaded during the second CPU clock cycle, $CC_2$, and the high byte is loaded during the third CPU clock cycle, $CC_3$. During these two CPU clock cycles the signals on user address bus 102 are irrelevant.

In the CPU clock cycles following the number of bytes/words to be loaded, CPU 302 begins loading the allocated plane of page buffer a byte/word at a time. This is shown as step 406 in FIG. 6. The first clock cycle of the load is indicated as $CC_4$ in FIG. 7. Each byte/word of data loaded by CPU 302 is accompanied by an address, which indicates the location within the plane where that particular byte is to be temporarily stored. The address signals are coupled to flash memory device 310 via user address bus 102.

Let us assume that CPU 302 finishes loading Plane A of page buffer 70 during the CPU clock cycle, $CC_N$. CPU 302 is able in the following clock cycle, $CC_{N+1}$, to command flash memory device 310 to begin programming flash memory cell array 20 with the data just loaded into Plane A. CPU 302 does so in step 408 of FIG. 6. CPU 302 signals the program with page buffer command by writing command code 0C (hexadecimal) to user data bus 104. Again, the particular command code representing a program from page buffer command is not important, to this method, only that the correct command code, whatever it is, be given by CPU 302 to flash memory device 310. CPU 302 completes the command in the following clock cycles, $CC_{N+2}$ and $CC_{N+3}$, by indicating the number of bytes within flash memory cell array 20 to be programmed from page buffer 70.

In the by 8 mode illustrated in FIG. 7, the 0 bit, A0, of user address bus 102 determines whether the data signals received during $CC_{N+2}$ are interpreted as the low byte or high byte of the 16 bit word indicating the number of bytes to be programmed.

Figure 8:
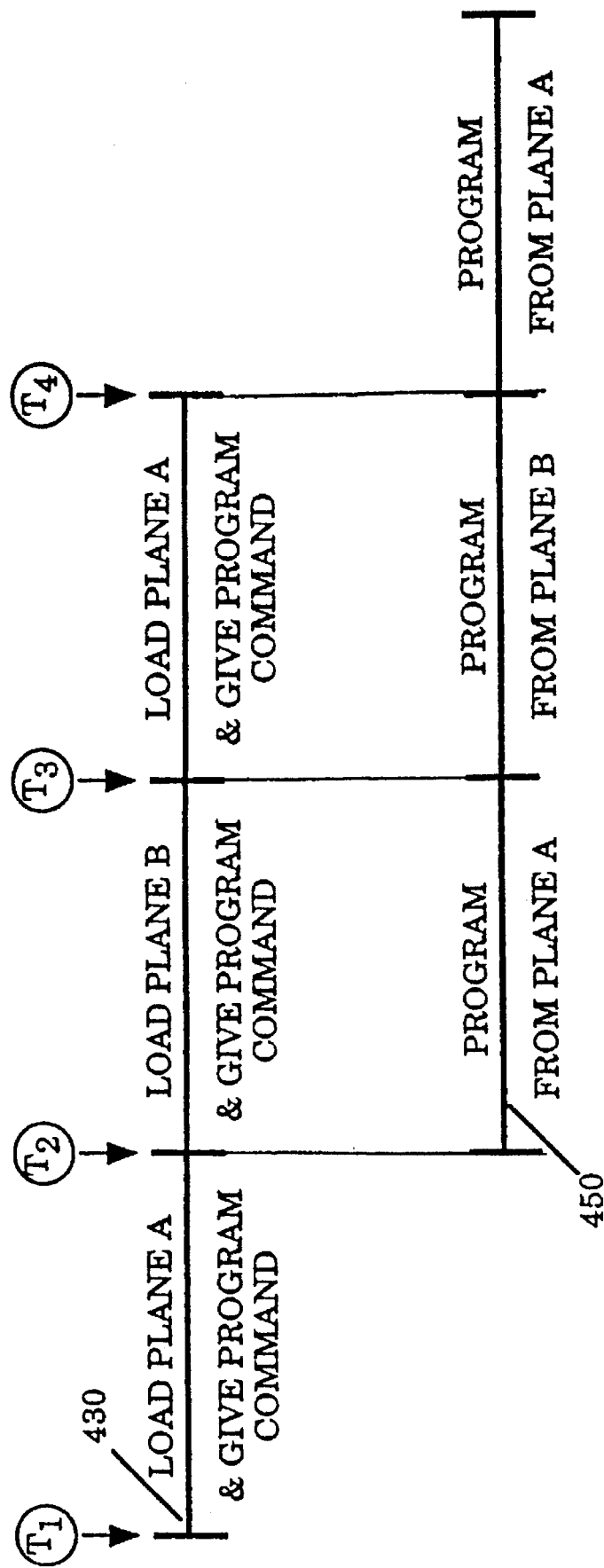
FIG. 8 illustrates the interleaving of program operations using the page buffer.

During the last CPU clock cycle of the program from page buffer command, $CC_{N+3}$, CPU 302 also informs flash memory device 310 of the starting address within flash memory cell array 20. CPU 302 couples the address/signals representing that address to flash memory device 310 via user address bus 102. Thus, in clock cycle $CC_{N+3}$ CPU 302 completes the tasks necessary to the first program task. During that same clock cycle, flash array controller 50 begins programming flash memory cell array 20. CPU 302 has completed its share of the first write cycle. This is indicated in FIG. 8 by time $T_2$. In FIG. 8 the upper line 430 is a time line indicating CPU tasks and the lower line 450 is a time line indicating flash memory device tasks. CPU 302 increases the data throughput of flash memory device 310 by loading plane B between time $T_2$ and time $T_3$ while flash array controller 50 is programming plane A, as shown by the overlap in time between the two time lines 430 and 450. This also decreases the deadtime of CPU 302 because it need not wait for flash array controller 50 to finish programming prior to initiating another write operation.

Having completed the loading of a plane of page buffer 70 at time $T_2$, CPU 302 faces a decision in step 41 0. Is more data to be programmed into flash memory device 310? If so, CPU 302 returns to step 400 and determines again whether a plane is available, while flash array controller 50 programs flash memory cell array 20 from Plane B. If more data is not to be programmed, CPU 302 ends its writing of flash memory device 310 by branching to step 412.

The actions indicated in FIG. 8 as being performed by CPU 302 between time $T_2$ and $T_3$ are acheived by repeating steps 400 through 408.

FIG. 6 describes a method of increasing data throughput of flash memory device 310 with respect to sequential writes to page buffer 70. The data throughput of flash memory device 310 can be increased even when only one byte at a time is loaded into a plane of page buffer 70. The increase in throughput derives from writing to one plane of page buffer 70 while flash array controller 50 is programming from the other plane.

Figure 9:
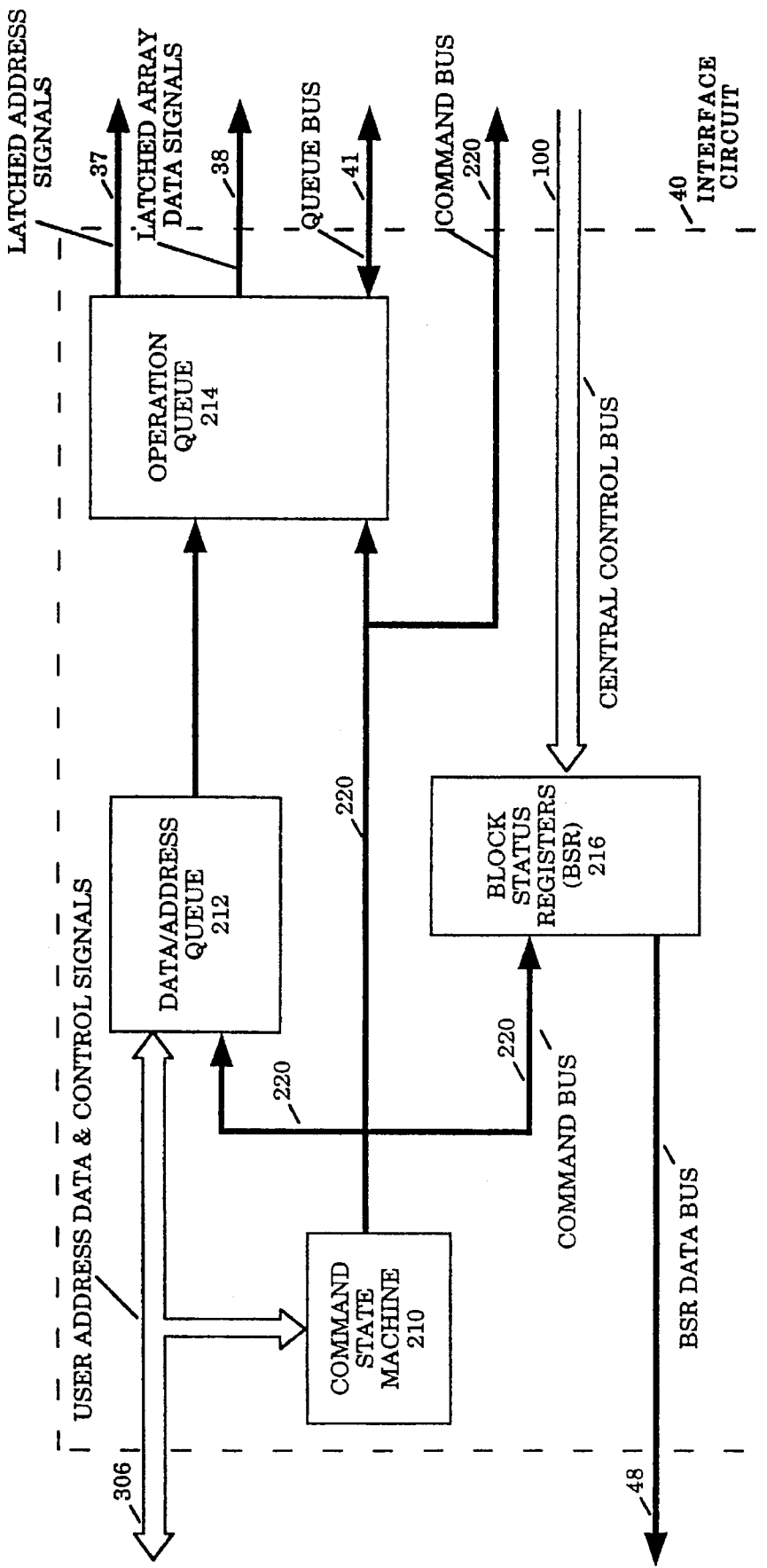
FIG. 9 is a block diagram of the interface circuit.

Given this explanation of using page buffer 70 to increase the data throughput of flash memory device 310, consider once again the organization and operation of flash memory device 310. Within device 310, page buffer 70 is controlled in part by interface circuit 40. FIG. 9 is a block diagram of interface circuit 40. Interface circuit 40 includes command state machine 210, data/address queue 212 operation queue 214, and block status registers (BSR) 216.

Command state machine 210 receives command signals from CPU 302 over user bus 306. Valid commands from CPU 302 include commands for programming a selected group of cells within flash memory cell array 20. The maximum size of the selected group depends on the width of the write path, which is 16 bits wide in one embodiment. In one embodiment, the number of cells programmed at one time depends on the addressing scheme selected, by 8 or by 16. Valid commands also include block erase, which results in an entire block of flash memory cells being erased at one time. CPU 302 may also command the programming and erasure of data stored within page buffer 70.

Command state machine 210 decodes the command signals, and generates control signals representing the commands and associated parameters to flash array controller 50 through operation queue 214. Command state machine 210 also transfers control signals over command bus 220 to control the mode of the planes of page buffer 70.

Command state machine 21 0 processes command signals for reading the status registers of BSR 216, including the global status register. Command state machine 210 selects the status registers of the BSR 216 by transferring address and control signals to BSR 216 via command bus 220.

Operation queue 214 transfers latched address signals 37 from data/address queue 212 to input multiplexer 35. Operation queue 214 also transfers latched array data 38 from data/address queue 212 to read/write path 30. Operation queue 214 transfers the verified commands and associated parameters to the flash array controller 50 over queue bus 41.

Command state machine 210 transfers the status register address over command bus 220 to select the addressed block status registers within BSR 216. The contents of the addressed status register are transferred from BSR 216 to output multiplexer 45 over BSR data bus 48. Command state machine 210 causes output multiplexer 45 to transfer the status register read data on the BSR data bus 48 over the user data bus 104.

Figures 10, 11, 12:
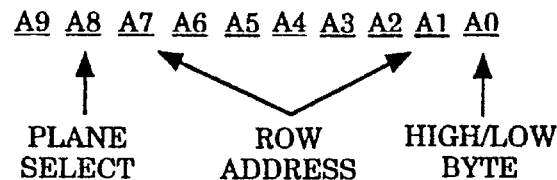
FIG. 10 illustrates the address bit fields for accessing the page buffer.
FIG. 11 illustrates plane assignment of the page buffer for accesses by the flash array controller.
FIG. 12 illustrates plane assignment of the page buffer for accesses by the interface circuit.

Consider again the organization of page buffer 70. FIG. 10 illustrates the address bit fields for accessing page buffer 70. The address bits shown are transferred over the FAC address bus 236, the IC address bus 222, or the FAC program counter bus 238 according to the mode 70. The address bits shown are transferred over FAC address bus 236, the IC address bus 222 or FAC program counter bus 238 according to the current mode. Address bit A8 functions as a plane select for selecting either Plane A 310 or Plane B 320. Address bits A7 through A1 select a row of Plane A 310 and the Plane B 320. Address bit A0 selects either the high byte or the low byte of a row.

Mode detector circuit 300 determines, as its name implies, the mode of page buffer 70. Mode detector circuit 300 generates two signals plane A mode 333 and plane B mode 335. Plane A mode signal 333 and plane B mode signals 335 each include three bits. Plane A mode signals 333 selects the mode for Plane A 310. Plane B mode 335 similarly selects the mode of Plane B 320.

Mode detector circuit 300 generates plane A mode signal 333 and the plane B mode signal 335 based upon FAC control signals 234 from flash array controller 50, the IC control signals 224 from the command state machine 210, and the test mode control signals 94.

FAC control signals 234 include bit 7 from FAC program counter, bit 1 of FAC address bus 236, and, the bits of the current FAC instruction.

IC control signals 224 include bit 8 IC address bus 222, an IC plane status signal, and IC plane select signal. IC control signals 224 include a FAC plane status signal, an FAC plane select signal, a single byte/word write signal, and a write sequential signal.

FIG. 11 defines the assignment of Plane A 310 and Plane B 320 for accesses by flash array controller 50. Plane assignment is determined by FAC plane select signal, the FAC plane status signal, and the FAC override signal.

If bits 0 and 1 of the FAC override signal are both a logical 0, the FAC plane select signal determines whether flash array controller 50 is allocated Plane A 310 or Plane B 320. FAC plane status signal indicates whether the plane indicated by the FAC plane select signal is available.

FAC override signals override the normal plane assignment when they are not 00, and allocate either Plane A 310 or Plane B 320 to flash array controller 50. Otherwise, plane assignment depends upon the FAC plane status signal and the FAC plane select signal.

FIG. 12 defines the assignment of Plane A 310 and Plane B 320 for accesses by interface circuit 40. The plane assignment for interface circuit 40 is determined IC plane status signal, and the IC plane select signal.

The IC plane select signal determines whether interface circuit 40 is allocated Plane A 310 or Plane B 320. The IC plane status signal indicates whether the plane selected by the IC plane select signal is available.

Command state machine 210 generates the IC plane status signal, the IC plane select signal, the FAC plane status signal, and the FAC plane select signal to allocate Plane A 310 and Plane B 320 to either flash array controller 50 or interface circuit 40. Command state machine 210 generates the IC and FAC plane status and plane select signals to ensure that Plane A 310 is not concurrently allocated to both flash array controller 50 and interface circuit 40. Similarly, command state machine 210 generates the IC and FAC plane status and plane select signals to ensure that Plane B 320 is not concurrently allocated to both flash array controller 50 and interface circuit 40.

The mode detector circuit 300 also generates FAC byte signal 352. FAC byte signal 352 indicates whether flash array controller 50 is performing a byte or a word access of page buffer 70. Mode detector circuit 300 determines the byte or word access by decoding the current FAC instruction.

Column select circuit 302 receives plane A mode signal 333 and the plane B mode signal 335, and FAC byte signal 352 from mode detector circuit 300. Column select circuit 302 also receives IC byte signal 344. IC byte signal 344 indicates whether the external user is performing a byte or a word access to page buffer 70. Byte or word accesses from the user are determined by a control input pin coupled to user control bus 106.

Column select circuit 302 receives bit 0 of the IC address bus 222 over a signal line 346, and bit 9 of the IC address bus 222 over a signal line 348. The column select circuit 302 receives bit 0 of the FAC address bus 236 over a signal line 350.

Column select circuit 302 generates a three bit plane A select signal 337 and a three bit plane B select signal 339. Plane A select signal 337 provides column select signals for Plane A 310. Plane B select signal 339 provides column select signals for Plane B 320.

FIG. 13 is a truth table showing the states of plane B select signals 339. Plane B select signals 339 are determined by plane B mode signal 335, the FAC override signal, the initialize, FAC address bit 0, the FAC byte signal 352, and IC byte signal 344.

FIG. 14 is a truth table showing the logical states of the plane A select signals 337. The logical states of plane A select signals 337 are determined by plane A mode signal 333, the FAC override signals, FAC address bit 0, IC address bit 0, FAC byte signal 352, and IC byte signal 344.

Plane A 310 receives input data via input multiplexer 304. Input multiplexer 304 receives data over FAC data bus 232 from flash array controller 50, and over user data bus 104 from external user. Input multiplexer 304 is controlled by plane A mode signal 333.

In modes 2 and 3, plane A mode signal 333 causes input multiplexer 304 to transfer input data from user data bus 104 to the input Plane A 310. In modes 4 and 5, plane A mode signal 333 causes input multiplexer 304 to transfer input data from FAC data bus 232 to the input of Plane A 310.

Plane B 320 receives input data under the control of input multiplexer 306. Input multiplexer 306 receives data over FAC data bus 232 from flash array controller 50, and over user data bus 104 from the user. Input multiplexer 306 is controlled by plane B mode signal.

In modes 2 and 3, plane B mode signal 335 causes input multiplexer 306 to transfer input data from user data bus 104 to the input of Plane B 320. In modes 4 and 5, plane B mode signal 335 causes input multiplexer 306 to transfer input data from FAG data bus 232 to the input of Plane B 320.

Plane A 310 outputs data over plane A data bus 340. Plane A data bus 340 is 19 bits wide. Plane A data bus 340 includes a high byte from column A, a low byte from column B, and 3 remnant bits from column C.

Plane B 320 outputs data via plane B data bus 342. Plane B data bus 342 is also 19 bits wide. The high byte of plane B bus 342 come from column A, the low byte from column B, and the 3 remnant bits come from column C.

Figure 15:
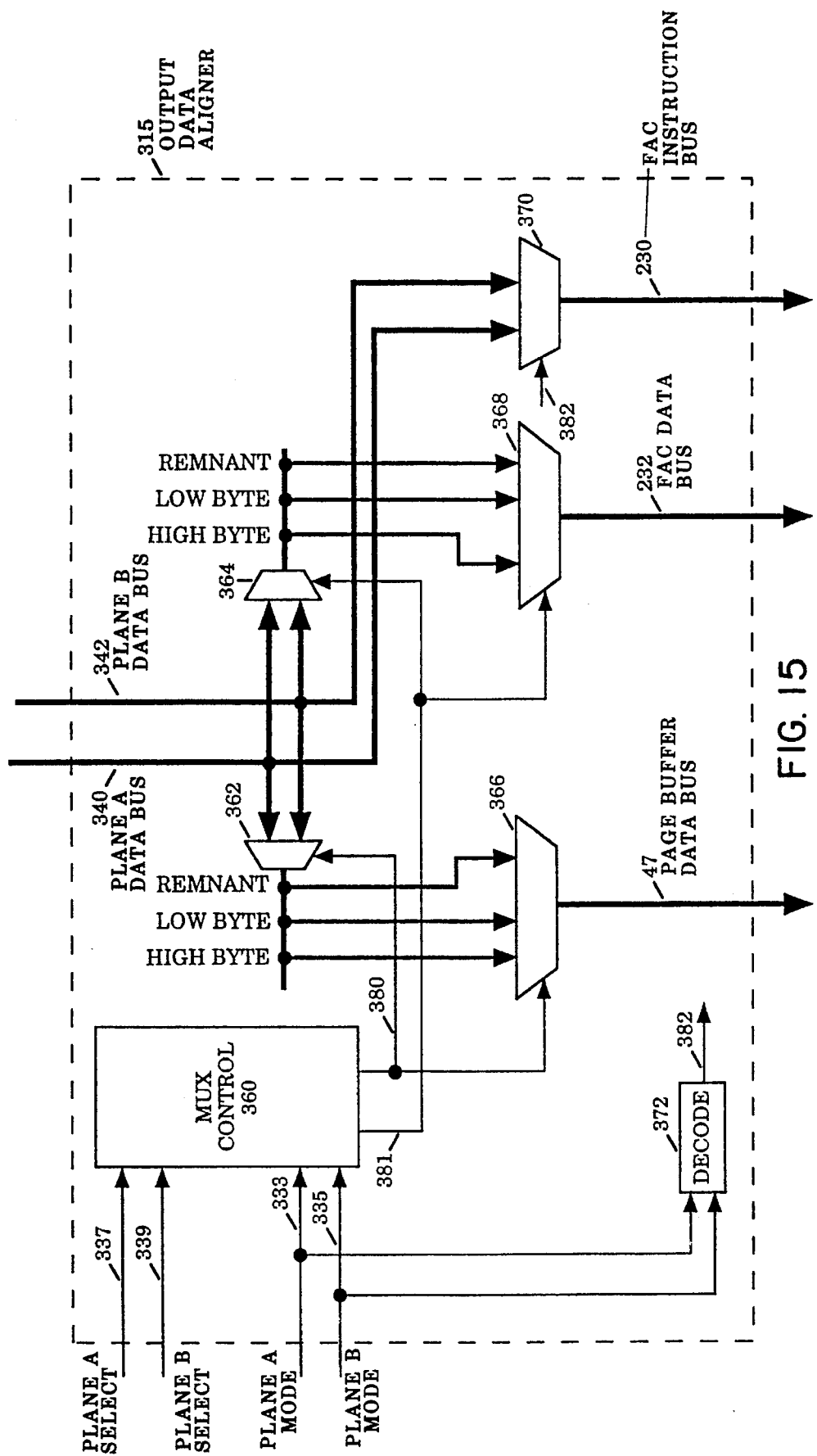
FIG. 15 is a block diagram of the output data aligner circuit.

FIG. 15 illustrates output data aligner circuit 315. Output data aligner circuit 315 transfers the output data from Plane A 310 and Plane B 320 over FAC instruction bus 230, FAC data bus 232 and IC data bus 47 according to the state of plane A mode signal 333, plane B mode signal 335, plane A select signal 337, and plane B select signal 339.

Output data aligner circuit 315 receives output data over plane A data bus 340 and plane B data bus 342. Output data aligner circuit 315 includes of a multiplexer control circuit 360, a decode circuit 372, a set of multiplexers 362–370.

Multiplexer control circuit 360 receives plane A select signal 337, plane B select signal 339, plane A mode signal 333, and plane B mode signal 335. Multiplexer control circuit 360 generates a pair of multiplexer control signals 380 and 381.

Decode circuit 372 receives plane A mode signal 333 and plane B mode signal 335. Decode circuit 372 generates multiplexer control signal 382.

Multiplexer 362 selectively couples Plane A data bus 340 and Plane B data bus 342 to the inputs of multiplexer 366. Plane A data bus 340 carries the high byte, the low byte and the remnant bits from Plane A 310. Similarly Plane B data bus 342 carries the high byte, the low byte and the remnant bits from Plane B 320. Multiplexer 362 selects between plane A data bus 340 and plane B data bus 342 based upon multiplexer control signal 380.

Multiplexer 366 selectively couples the received high byte, the received low byte and the received remnant bits to IC data bus 47 under control of the multiplexer control signal 380. In one embodiment, IC data bus 47 is 16 bits wide.

Multiplexer 364 selects between Plane A data bus 340 and Plane B data bus 342 as inputs to multiplexer 368. Multiplexer 364 selects between Plane A data bus 340 and Plane B data bus 342 to based upon multiplexer control signal 381.

Multiplexer 368 couples the received high byte, the received low byte and the received remnant bits to FAC data bus 232 under control of the multiplexer control signal 381. For one embodiment, the FAC data bus 232 is 16 bits wide.

Multiplexer 370 receives output data from Plane A 310 over plane A data bus 340. Multiplexor 370 also receives output data from Plane B 320 over plane B data bus 342. Multiplexer 370 selects between Plane A and Plane B output data under control of the multiplexer control signal 382. In one embodiment, FAC instruction bus 230 to which multiplexor 370 is coupled, is 19 bits wide and includes the high and low bytes from columns A and B and the three remnant bits from column C.

FIG. 16 is a truth table for output data aligner circuit 315. FIG. 16 defines which data is coupled to data bus 47 in terms of the states of plane A mode signal 333, plane A select signal 337, the plane B mode signal 335, and plane B select signal 339.

FIG. 17 is another truth table for output data aligner circuit 315. FIG. 18 defines the data output to FAC data bus 232 based upon the state of plane A mode signal 333, plane A select signal 337, plane B mode signal 335, and plane B select signal 339.

Thus, in the foregoing description a method of improving the data throughput of a flash memory device has been described. The method pipelines write operations using a page buffer within the flash memory device, thereby increasing the data throughput of the flash memory device.

In the foregoing specification the invention has been described with reference to specific exemplary embodiments thereof. It will, however, be evident that various modifications and changes may be made thereto without departing from the broader spirit and scope of the invention as set forth in the appended claims. The specification and drawings are accordingly to be regarded as illustrative rather than a restrictive sense.

What is claimed is:

1. A method of increasing data throughput of a flash memory device including a flash memory array, an array controller and a page buffer, the page buffer including a first plane and a second plane, the array controller controlling a programming of the flash memory array, the array controller being coupled to the page buffer, the method comprising the steps of:
   a) loading the first plane with a first byte of data;
   b) commanding the array controller to program the flash memory array with the first byte of data stored in the first plane;
   c) loading the second plane with a second byte of data while the array controller is programming the flash memory array with the first byte of data stored in the first plane; and
   d) commanding the array controller to program the flash memory array with the second byte of data stored in the second plane.

2. The method of claim 1 further comprising the step of:
   a) first determining whether a plane of the page buffer is available for user access.

3. The method of claim 2 wherein the step of determining whether a plane is available includes reading a status register of the flash memory array.

4. The method of claim 1 wherein the first plane and the second plane of the page buffer comprise static random access memory.

5. The method of claim 1 wherein step c) occurs in a clock cycle immediately following step b).

6. The method of claim 5 wherein the first plane and the second plane of the page buffer comprise static random access memory.

7. A computer implemented method of increasing data throughput of a flash memory device, the flash memory device including a flash memory array, an array controller and a page buffer, the page buffer including a first plane and a second plane, the array controller controlling a programming of the flash memory array, the array controller being coupled to the page buffer, the method comprising the computer implemented steps of:
   a) loading the first plane with a byte of data by coupling a first set of data signals to the flash memory device;
   b) commanding the array controller to program the flash memory array with the first byte of data stored in the first plane by coupling command signals to the flash memory device representing a command to program from the page buffer;
   c) while the array controller is programming the flash memory array, loading the second plane with a block of data by coupling data signals representing the block of data to the flash memory device; and
   d) commanding the array controller to program the flash memory array with the block of data stored in the second plane by coupling command signals to the flash memory device representing a command to program from the page buffer.

8. The method of claim 7 further comprising the step of:
   a) first determining whether a plane of the page buffer is available.

9. The method of claim 8 wherein the step of determining whether a plane is available includes reading a status register of the flash memory device by coupling status request signals to the flash memory device.

10. The method of claim 7 wherein step b) occurs in a clock cycle immediately following step a).

11. The method of claim 7 wherein step c) occurs in a clock cycle immediately following step b).

12. The method of claim 7 wherein step d) occurs in a clock cycle immediately following step c).

13. A computer implemented method of increasing data throughput of a flash memory device, the flash memory device including a flash memory array, an array controller and a page buffer, the page buffer including a first plane and a second plane, the array controller controlling a programming of the flash memory array, the array controller being coupled to the page buffer, the method comprising the computer implemented steps of:
   a) loading the first plane with a first block of data by sequentially coupling a first set of data signals representing the first block of data to the flash memory device;
   b) commanding the array controller to program the flash memory array with the first block of data stored in the first plane by coupling command signals representing a command to program from the page buffer;
   c) while the array controller is programming the flash memory array with the first block of data stored in the first plane, loading the second plane with a second block of data by sequentially coupling data signals representing the second block of data to the flash memory; and
   d) commanding the array controller to program the flash memory array with the second block of data stored in the second plane by coupling command signals representing a command to program from the page buffer to the flash memory device.

14. The method of claim 13 further comprising the step of:
   a) first determining whether a plane of the page buffer is available.

15. The method of claim 14 wherein the step of determining whether a plane is available includes reading a status register of the flash memory device.

16. The method of claim 13 wherein step b) occurs in a clock cycle immediately following step a).

17. The method of claim 13 wherein step c) occurs in a clock cycle immediately following step b).

18. The method of claim 13 wherein step d) occurs in a clock cycle immediately following step c).

19. The method of claim 13 wherein the first plane and the second plane of the page buffer comprises static random access memory.

20. The method of claim 13 wherein the step of loading the first plane further comprises the step of:

first commanding a sequential load of the page buffer by coupling command signals representing the sequential load of the page buffer to the flash memory device.

21. The method of claim 20 wherein commanding the sequential load of the page buffer includes the step of:

signaling a number of bytes of data to be loaded into the page buffer.

22. The method of claim 13 wherein the step of loading the second plane further comprises the step of:

first commanding a sequential load of the page buffer by coupling command signals representing the sequential load of the page buffer to the flash memory device.

23. The method of claim 22 wherein commanding the sequential load of the page buffer includes the step of:

signaling a number of bytes of data to be loaded into the page buffer.

24. The method of claim 13 wherein the steps of commanding the array controller to program the flash memory array from the page buffer include signaling a starting address within flash memory array.

* * * * *

UNITED STATES PATENT AND TRADEMARK OFFICE
CERTIFICATE OF CORRECTION

PATENT NO.   :   5,519,847
DATED        :   May 21, 1996
INVENTOR(S)  :   Fandrich et al.

It is certified that error appears in the above-identified patent and that said Letters Patent is hereby corrected as shown below:

In column 10, at line 20, delete "FAG" and substitute --FAC--

Signed and Sealed this

Twenty-fourth Day of September, 1996

Attest:

BRUCE LEHMAN

Attesting Officer                Commissioner of Patents and Trademarks